United States Patent [19]

Hulstrunk

[11] 4,141,028

[45] Feb. 20, 1979

[54] CONTACT CLIP

[75] Inventor: William Hulstrunk, Millburn, N.J.

[73] Assignee: RCA Corporation, New York, N.Y.

[21] Appl. No.: 823,329

[22] Filed: Aug. 10, 1977

[51] Int. Cl.² ........................................... H01L 23/48
[52] U.S. Cl. ..................................... 357/68; 357/71; 357/79
[58] Field of Search ........................... 357/68, 71, 79

[56] References Cited

U.S. PATENT DOCUMENTS

| | | | |
|---|---|---|---|
| 3,111,352 | 11/1963 | Theodoseau | 357/79 |
| 3,896,544 | 7/1975 | Fosnough | 357/79 |

*Primary Examiner*—Edward J. Wojciechowicz
*Attorney, Agent, or Firm*—H. Christoffersen; R. A. Hays; R. Ochis

[57] ABSTRACT

A contact clip, primarily for use in semiconductor devices comprises a layer of material having a relatively high coefficient of thermal expansion and another layer of relatively low coefficient of thermal expansion. Such a clip improves the contact between the clip and the semiconductor pellet to which it is soldered not only during device assembly but also at high operating temperatures as well.

8 Claims, 3 Drawing Figures

CONTACT CLIP

The present invention relates generally to semiconductor devices and, in particular, relates to contact clips used in such devices.

Many semiconductor devices comprise a contact clip which provides an electrically conductive path from a wire lead to a semiconductor pellet. Usually, such a clip is made of a conductive, somewhat springy material so that it can be placed over the wire lead in such a fashion that it exerts a slight pressure thereon to insure good electrical contact. Contact clips are placed on the wire leads which extend through the header of the device, just prior to the mounting of the semiconductor pellet to the header. For example, conventional device assembly procedures generally comprise the steps of: (a) placing a solder preform on a package header; (b) placing the semiconductor pellet thereon; (c) pushing the contact clips over the wire leads so that contact is made to the semiconductor pellet. Usually, the clips are pushed far enough along the wire leads so that when the assembly is heated and the solder preform melts, a slight pressure is exerted on the pellet by the clips to insure a good solder bond between the pellet and the header as well as between the contact clip and the pellet.

Occasionally, however, the contact between the pellet and the clip fractures due to, among other reasons, the slight dropping of the pellet toward the header during the soldering process. That is, for example, if the clips are not placed far enough on the leads, the pellet tends to drop below the contact level of the clips when the preform is melted. This results in a poor solder connection between the pellet and header and/or between the clip and the pellet. Alternatively, such a fracture can also occur after the device is fully assembled during any high temperature operation thereof since, in such a case, the solder may soften and cause the clip to break away from the pellet and thus operationally destroy the device.

A contact clip utilizing the principles of the present invention substantially insures constant pressure on the pellet during the mounting procedure and also substantially insures that the clip remains in contact with the pellet at high temperatures.

Figure 1:
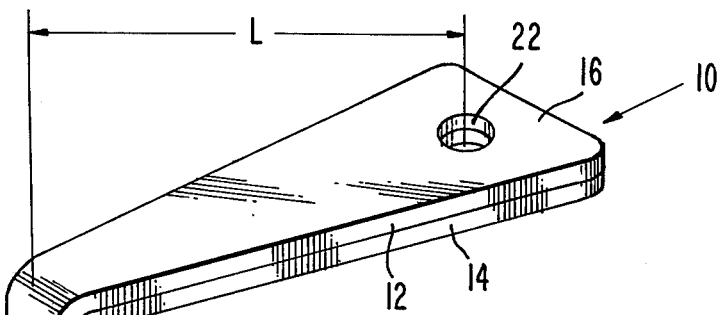
FIG. 1 is a pictorial view of a contact clip, not drawn to scale, embodying the principles of the present invention.

A contact clip, indicated generally at 10 in the drawing, embodying the principles of the present invention, comprises first and second layers, 12 and 14 respectively, of conductive materials. The material of the first layer 12 has a comparatively higher coefficient of thermal expansion than the material of the second layer 14. While the contact clip can take any shape necessary for the particular device application, it is preferred that it have a relatively wider end 16 and a relatively narrower end 18.

In one embodiment, it is preferred that there be an "S" shaped bend, relatively close to the narrower end 18 to provide a foot portion 20 which, as discussed below, contacts a semiconductor pellet.

The contact clip 10 also has means 22 for securing the wider end 16 of the contact clip at a point distal from the narrow end 18. The means 22 can be an opening through the clip 10 proximate the relatively wider end 16.

Although other materials can be used, it is preferred that the material of the first layer 12 be substantially comprised of copper and have a coefficient of thermal expansion of about 18 micro in/in/° C. Further, the material of the second layer 14 is preferably substantially comprised of nickel having a coefficient of thermal expansion of about 13 micro in/in/° C. Thus, in this example, the difference between the coefficients of thermal expansion of the first and second layers 12 and 14 respectively, is on the order of about 5 micro in/in/° C. As mentioned above, other materials can be used for the first and second layers, 12 and 14 respectively, however, in order to be effective, the difference between the coefficients of thermal expansions of the materials of the first and second layers, 12 and 14 respectively, must be positive. That is, $T_{first} - T_{second} > 0$; where $T_{first}$ is the coefficient of thermal expansion of the first layer 12 and $T_{second}$ is the coefficient of thermal expansion of the second layer 14.

While the clip 10 can be utilized in almost any semiconductor device, the exemplary discussion hereinafter is directed to a semiconductor device assembled in what is conventionally known as a TO-3 package. In such a package the length L of the contact clip 10 between the means 22 and the foot portion 20 of the "S" shaped bend is usually on the order of about 0.635 cm. (0.25 in.).

Figure 2:
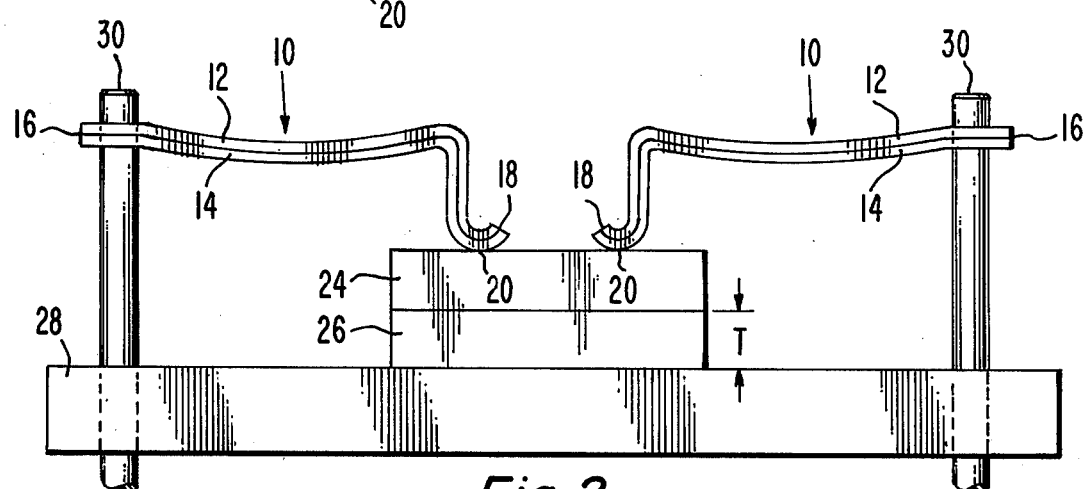
FIG. 2 is a pictorial view of a semiconductor device, not drawn to scale, during the assembly thereof prior to the pellet soldering step.

As shown in FIG. 2, a semiconductor pellet 24 is positioned on a solder preform 26 which is placed on a header 28 to which the pellet 24 is to be secured. Projecting through the header 28 are, in this example, a pair of wire leads 30. As shown, the contact clips 10 are placed over the leads 30 so that the foot portion 20 of each clip 10 initially exerts a slight pressure on the pellet 24 at room temperature. Preferably, the size and shape of the opening 22 is such that the clip 10 becomes somewhat rigidly affixed to the wire leads 30 when the clip 10 is placed thereon. Each clip 10 is arranged so that it contacts a particular preselected region (not shown) of the pellet 24. Further, it is imperative that the clip 10 be oriented such that the second layer 14 is facing the pellet 24 over substantially all of the length L. Preferably, the solder preform initially has a thickness T, which is on the order of about 0.00015 of an inch and a composition of about 5% tin and 95% lead. In addition, it is preferred, for reasons known in the art, that the contact clip 10 be tinned, at least at each end, 16 and 18, with a thin layer of solder (not shown).

Figure 3:
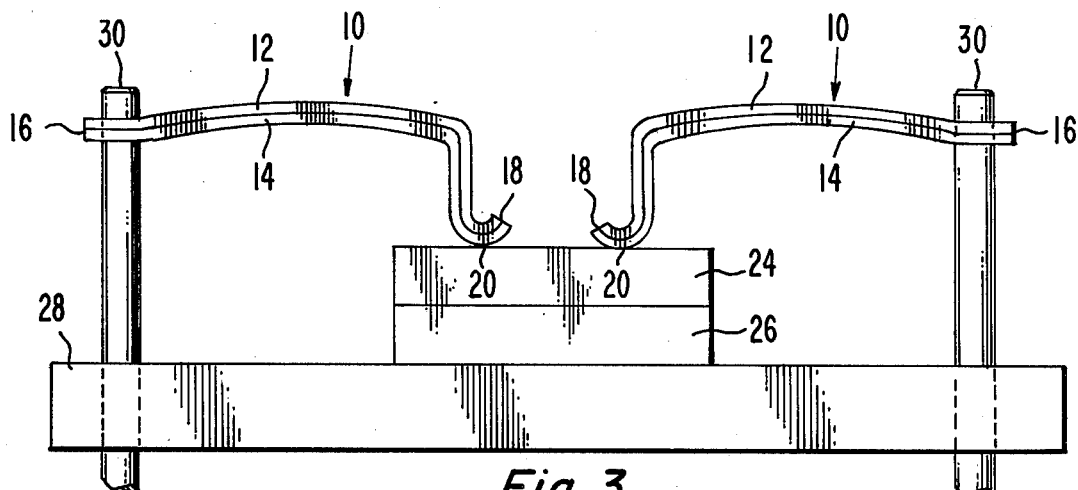
FIG. 3 is a pictorial view of the semiconductor device shown in FIG. 2 under high temperature conditions.

As shown in FIG. 3, when the above-described assembly is heated, for example, to a temperature of about 420° C, each contact clip 10, due to the positive difference in the coefficients of thermal expansion between the first and second layers, 12 and 14 respectively, bends toward the header 28 and thereby exerts an increased pressure on the pellet 24. The amount of pressure exerted is, as known in the art, primarily dependent on the temperature involved, the length L of the clip and the size of the positive difference in the coefficients of thermal expansion between the first and second layers, 12 and 14 respectively. Thus, it will be understood by those in the art, that almost any reasonable pressure is achievable by properly adjusting these parameters.

This pressure substantially insures that the pellet 24 is thoroughly soldered to the header 28 via the preform 26 of solder. When the completed device is operated at high temperatures which would normally cause conventional clips to pull away, due to the softening of the solder, from the pellet 24, the novel contact clip 10 instead exerts pressure on the pellet 24.

The contact clip 10 can be fabricated by, for example, brazing, electron beam welding or plating the first and second layers, 12 and 14 respectively, to each other. Of course, any other known fabrication technique can also be used. The materials of the first and second layers, 12 and 14 respectively, should also have a slight amount of springiness in order to insure continuous contact after the heat has been removed.

The use of a contact clip 10 embodying the principles of the present invention not only assists in the fabrication of semiconductor devices, but also insures a continuous contact with the various regions within a pellet 24 during high temperature operation of such a device. Thus, devices utilizing such contact clips 10 are more reliable and stable during high temperature operation.

What is claimed is:

1. A semiconductor device comprising:
   a semiconductor pellet mounted on a surface of a header;
   an electrically conductive contact clip having one end thereof in electrical contact with said pellet, said clip having a mounting portion thereof which is distal from said one end, said clip having a first layer extending parallel to the length thereof, said first layer having a coefficient of thermal expansion, said clip having a second layer extending parallel to the length thereof, said second layer having a comparatively lower coefficient of thermal expansion than said first layer and said clip being oriented such that said second layer is nearer said pellet and said surface of said header than said first layer is to cause said one end to press on said pellet with increasing force as the temperature of the contact clip increases and thereby increase the force pressing said pellet against said header; and
   means for supporting said mounting portion of said contact clip in substantially fixed relation to said header.

2. A semiconductor device as claimed in claim 1 wherein:
   said mounting portion of said contact clip is rigidly affixed with respect to said header.

3. A semiconductor device as claimed in claim 1 wherein:
   said clip has an "S" shaped bend relatively close to said one end whereby a foot portion is provided; and
   said foot portion contacts said pellet.

4. A semiconductor device as claimed in claim 1 wherein:
   said first layer comprises copper; and
   said second layer comprises nickel.

5. A semiconductor device as claimed in claim 1 wherein:
   said header has at least one wire lead associated therewith;
   said mounting portion of said contact clip is affixed to said wire lead; and
   said wire lead serves as said means for supporting.

6. A semiconductor device as claimed in claim 1 wherein:
   said one end of said clip is relatively narrower than the other end thereof.

7. A semiconductor device as claimed in claim 1 wherein:
   said first layer is brazed to said second layer.

8. The semiconductor device recited in claim 1 wherein:
   said one end is tinned with a layer of solder; and
   said mounting portion is tinned with a layer of solder.

* * * * *